(12) United States Patent
Lee

(10) Patent No.: US 12,165,964 B2
(45) Date of Patent: Dec. 10, 2024

(54) COMPONENT CARRIER WITH EMBEDDED INTERPOSER LATERALLY BETWEEN ELECTRICALLY CONDUCTIVE STRUCTURES OF STACK AND METHOD FOR MANUFACTURING THE COMPONENT CARRIER

(71) Applicant: AT&S Austria Technologie & Systemtechnik Aktiengesellschaft, Leoben (AT)

(72) Inventor: Minwoo Lee, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 180 days.

(21) Appl. No.: 17/247,430

(22) Filed: Dec. 10, 2020

(65) Prior Publication Data
US 2021/0193562 A1 Jun. 24, 2021

(30) Foreign Application Priority Data
Dec. 20, 2019 (CN) .......................... 201911326757.9

(51) Int. Cl.
*H01L 23/498* (2006.01)
*H01L 21/48* (2006.01)
(Continued)

(52) U.S. Cl.
CPC ...... *H01L 23/49833* (2013.01); *H01L 21/481* (2013.01); *H01L 21/486* (2013.01);
(Continued)

(58) Field of Classification Search
CPC . H05K 1/11; H05K 1/115; H05K 1/18; H05K 1/181–187; H05K 3/30;
(Continued)

(56) References Cited

U.S. PATENT DOCUMENTS 7,821,795 B2 * 10/2010 Sugaya ............... H01L 23/3128
361/523
8,183,465 B2 * 5/2012 Suzuki ............... H01L 23/49816
361/321.1
(Continued)

FOREIGN PATENT DOCUMENTS

| CN | 102474992 A | 5/2012 |
| JP | 2012074536 | 4/2012 |
| JP | 2016195238 A | 11/2016 |

OTHER PUBLICATIONS

Kästner, M.; Extended European Search Report in Application No. 20 213 061.3; pp. 1-8; May 7, 2021, European Patent Office; 80298, Munich, Germany.
(Continued)

*Primary Examiner* — Tuan T Dinh
(74) *Attorney, Agent, or Firm* — Robert A. Blaha; Smith Tempel Blaha LLC

(57) ABSTRACT

A component carrier and a method of manufacturing a component carrier are disclosed. The component carrier includes a stack with at least one electrically conductive layer structure and/or at least one electrically insulating layer structure, an interposer embedded in the stack and having a plurality of vertically extending electrically conductive through connections, and electrically conductive structures in the stack laterally on both sides of the interposer.

19 Claims, 5 Drawing Sheets

(51) Int. Cl.
*H01L 23/31* (2006.01)
*H05K 1/11* (2006.01)
*H05K 1/18* (2006.01)
*H05K 3/36* (2006.01)
*H01L 23/66* (2006.01)

(52) U.S. Cl.
CPC .... *H01L 23/3128* (2013.01); *H01L 23/49838* (2013.01); *H05K 1/115* (2013.01); *H05K 1/185* (2013.01); *H05K 3/36* (2013.01); *H01L 23/66* (2013.01); *H01L 2223/6677* (2013.01); *H05K 2201/09118* (2013.01); *H05K 2201/10378* (2013.01); *H05K 2203/1327* (2013.01)

(58) Field of Classification Search
CPC . H05K 3/36; H05K 3/38; H01L 23/66; H01L 23/49833; H01L 23/49838; H01L 23/49822; H01L 23/49816; H01L 23/49827; H01L 23/5384–5385
USPC ............... 361/300–306, 764, 767, 784, 790, 361/792–795, 803; 257/690; 174/520
See application file for complete search history.

(56) References Cited

U.S. PATENT DOCUMENTS

| | | | | |
|---|---|---|---|---|
| 8,451,618 B2* | 5/2013 | Boeck | ............... | H01L 24/14 361/764 |
| 8,654,539 B2* | 2/2014 | Nakanishi | ......... | H01L 23/49827 257/532 |
| 9,659,852 B2* | 5/2017 | Kim | ............... | H01L 24/17 |
| 2007/0045814 A1* | 3/2007 | Yamamoto | ........... | H05K 1/0231 257/E23.062 |
| 2007/0064375 A1* | 3/2007 | Urashima | ............... | H01L 23/50 257/E23.079 |
| 2008/0239685 A1* | 10/2008 | Kawabe | ................... | H01G 4/33 361/782 |
| 2008/0251285 A1* | 10/2008 | Sato | ..................... | H05K 1/0231 361/313 |
| 2010/0300602 A1* | 12/2010 | Ichiyanagi | ............. | H01L 23/50 156/89.12 |
| 2011/0018099 A1* | 1/2011 | Muramatsu | ............ | H05K 1/162 257/532 |
| 2011/0220404 A1* | 9/2011 | Yamasaki | ............ | H05K 3/4602 29/846 |
| 2011/0291288 A1* | 12/2011 | Wu | ........................ | H01L 24/81 257/773 |
| 2012/0146209 A1 | 6/2012 | Hu et al. | | |
| 2013/0074332 A1* | 3/2013 | Suzuki | ................... | H05K 1/185 29/834 |
| 2013/0264101 A1 | 10/2013 | Furuichi et al. | | |
| 2013/0307155 A1* | 11/2013 | Mitsuhashi | ....... | H01L 23/49827 257/761 |
| 2014/0027925 A1 | 1/2014 | Chan et al. | | |
| 2014/0102772 A1 | 4/2014 | Chen et al. | | |
| 2014/0102777 A1 | 4/2014 | Chen et al. | | |
| 2016/0105966 A1 | 4/2016 | Tomikawa et al. | | |
| 2016/0293535 A1* | 10/2016 | Fukasawa | ........... | H01L 23/5385 |
| 2017/0005023 A1 | 1/2017 | Chen et al. | | |
| 2017/0202083 A1* | 7/2017 | Baek | ................ | H01L 23/49833 |
| 2018/0061741 A1* | 3/2018 | Beyne | ............... | H01L 23/49827 |
| 2018/0315735 A1 | 11/2018 | Delacruz et al. | | |
| 2019/0104615 A1 | 4/2019 | Furutani et al. | | |
| 2019/0200462 A1 | 6/2019 | Furutani et al. | | |
| 2019/0267307 A1* | 8/2019 | Lin | ..................... | H01L 23/3737 |
| 2019/0304952 A1* | 10/2019 | Weis | ....................... | H01L 24/16 |

OTHER PUBLICATIONS

Office Action in Application No. 201911326757.9; pp. 1- ; Sep. 29, 2023; China National Intellectual Property Administration, No. 6, Xitucheng Lu, Jimenqiao Haidian District, Beijing, 100088, China.

* cited by examiner

COMPONENT CARRIER WITH EMBEDDED INTERPOSER LATERALLY BETWEEN ELECTRICALLY CONDUCTIVE STRUCTURES OF STACK AND METHOD FOR MANUFACTURING THE COMPONENT CARRIER

CROSS-REFERENCE TO RELATED APPLICATIONS

This application claims the benefit of the filing date of the Chinese Patent Application No. 201911326757.9, filed Dec. 20, 2019, the disclosure of which is hereby incorporated herein by reference.

TECHNICAL FIELD

The disclosure relates to a method of manufacturing a component carrier, and to a component carrier.

BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

SUMMARY

There may be a need to efficiently form electric connections in a component carrier.

According to an exemplary embodiment of the invention, a component carrier is provided, wherein the component carrier comprises a stack (in particular a laminated stack) comprising at least one electrically conductive layer structure (in particular a plurality of electrically conductive layer structures) and/or at least one electrically insulating layer structure (in particular a plurality of electrically insulating layer structures), an interposer having a plurality of vertically extending electrically conductive through connections and being embedded in the stack, and (in particular vertically extending) electrically conductive structures in the stack laterally on both sides of the interposer.

According to another exemplary embodiment of the invention, a meth-od of manufacturing a component carrier is provided, wherein the method comprises providing a stack comprising at least one electrically conductive layer structure and/or at least one electrically insulating layer structure, embedding an interposer, having a plurality of vertically extending electrically conductive through connections, in the stack, and forming electrically conductive structures in the stack laterally on both sides of the interposer.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board and an IC (integrated circuit) substrate. A component carrier may also be a hybrid board combining different ones of the above-mentioned types of component carriers.

In the context of the present application, the term "stack" may particularly denote a flat or planar structure or laminate, in particular formed by bonding together two or more thin sheets or layer structures arranged on top of each other. Such layer structures may be arranged and/or formed parallel to one another and may be connected to one another by the application of temperature and/or mechanical pressure.

In the context of the present application, the term "layer structure" may particularly denote a continuous layer, a patterned layer or a plurality of non-consecutive islands within a common plane.

In the context of the present application, the term "interposer" may particularly denote an inlay or member configured for providing electric interconnections. An interposer may comprise a dielectric, semiconductive or poorly electrically conductive base body and a plurality of vertically extending electrically conductive (in particular metallic) through connections configured for establishing an electrically conductive connection between a lower side and an upper side of the interposer. For instance, the base body can be made of glass, ceramic, brass, plastic or semiconductor material. The vertically extending electrically conductive through connections may for instance be made of copper or aluminum.

In the context of the present application, the term "vertical" may particularly refer to a thickness direction of the preferably plate-shaped component carrier.

In the context of the present application, the term "lateral" may particularly refer to a direction within a horizontal plane of the preferably plate-shaped component carrier perpendicular to its vertical thickness direction.

According to an exemplary embodiment of the invention, a component carrier (for instance a printed circuit board, PCB) may be provided which has an embedded interposer for providing a compact high-performance electrically conductive connection in a vertical direction of the plate-shaped component carrier. Embedding such an interposer in a (for instance laminated) component carrier may allow accomplishing even complex electric circuitry in the interior of the component carrier. However, said preferably high integration density electric coupling provided by the interposer may be spatially limited to a region in the component carrier where it is really needed. Thus, the interposer may be accompanied by additional electrically conductive structures formed in the stack and extending side by side to the interposer (i.e., between opposing main surfaces of the plate-shaped component carrier and in a cross-sectional view on the left-hand side and on the right-hand side of the interposer). The latter electrically conductive structures may be formed in component carrier technology, for instance by patterned metal layers and/or by metal filled vias. As a result, the manufacturing effort of the additional electrically conductive structures besides the embedded interposer is very low. Hence, the provision of a high-density interconnect provided by the interposer may be limited to specific regions of the component carrier in which such a high-density integration is really needed (for instance for properly electrically connecting surface mounted and/or embedded components such as semiconductor chips). Other portions of the component carrier may be provided with simply manufacturable additional electrically conductive connections which can be manufactured with low effort. By taking this measure, a hybrid component carrier is provided which combines the advantage of a simple manufacturability of component carrier technology (in particular PCB technology) with a sophisticated electric connection capability of interposer technology. The additional electrically conductive structures in the stack lateral to the interposer may efficiently use free spaces within the component carrier to provide an additional connection function with low effort.

In the following, further exemplary embodiments of the manufacturing method and the component carrier will be explained.

In an embodiment, the electrically conductive structures are further vertically extending electrically conductive through connections. Thus, vertically electrically conductive through connections may be formed both in the interposer and in the organic portion of the component carrier, i.e., in its (preferably laminated) stack.

In an embodiment, the vertically extending through connections of the interposer have a higher integration density than the further vertically extending electrically conductive through connections of the stack. By taking such a measure, a region in the component carrier requiring a high number of electric connections per volume may be provided by the interposer, whereas other regions of the component carrier in which a smaller number of electric connections per volume is sufficient may be provided by the electrically conductive structures laterally on both sides of the interposer. Hence, the overall effort of manufacturing the component carrier may be kept small without compromising on the required electronic coupling functionality of the component carrier.

In an embodiment, each one of the vertically extending electrically conductive through connections of the interposer has a smaller cross-sectional area than each of the further vertically extending electrically conductive through connections of the stack. Thus, the smaller integration density of electrically conductive structures in the stack as compared to the interposer may also be reflected by a smaller horizontal cross-sectional area of said electrically conductive through connections in the interposer compared to the stack.

In an embodiment, the stack comprises a core in which the interposer is embedded. Such a core may be a thick plate-shaped constituent of the component carrier vertically centrally in the layer stack and being made of a fully cured material. Thus, such a core may provide mechanical support during the build-up of the component carrier. Furthermore, a cavity (such as a through-hole) in the core may be used for accommodating the interposer. For example, such a core may be made of FR4 material, i.e., cured epoxy resin with reinforcing particles such as glass cloths therein.

In an embodiment, the component carrier comprises only a single interposer. Thus, embedding only a single interposer may be sufficient in an embodiment in which all high integration density electric coupling is concentrated on a single region within the component carrier. This keeps the effort of manufacturing the component carrier small.

In another embodiment, the component carrier comprises a plurality of interposers (for instance two interposers) which are embedded in the stack and which are arranged side by side. By providing multiple interposers, preferably arranged side by side in the layer stack, it is also possible to comply with applications in which more than one region within the component carrier requires high integration density. The electrically conductive structures laterally on both sides of the interposers may then be provided between sidewalls of the component carrier and the respective interposer. It is also possible that said electrically conductive structures of the stack are also arranged between the interposers.

In an embodiment, the component carrier comprises at least one embedded component embedded in the stack laterally of the interposer. Highly advantageously, one or more components (such as semiconductor chips) may be embedded in the layer stack, apart from the one or more interposers. For instance, a common core may be provided with multiple cavities in which the at least one interposer and the at least one component may be embedded. Thus, a high functional performance may be achieved in a compact configuration.

Additionally or alternatively, the component carrier may comprise at least one stack-mounted component mounted on the stack and electrically connected with the interposer. Hence, in addition or as an alternative to the embedding of a component in the layer stack, it is also possible to provide at least one electronic component being surface mounted on an exterior main surface of the stack. Such a surface-mounted component may be electrically connected within the stack by the vertically extending electrically conductive through connections of the interposer and/or by the further electrically conductive structures provided by the stack laterally of the interposer.

In an embodiment, a cavity is formed between one stack-mounted component and the stack. In such a configuration, another stack-mounted component, which is also mounted on the stack, may be accommodated in the cavity. In such a space-saving configuration, it may thus be possible that one stack-mounted component is mounted over and above another stack-mounted component. The latter can then also be mechanically protected by the former without additional effort.

In an embodiment, the component carrier comprises an encapsulation structure on the stack, wherein the at least one stack-mounted component may be encapsulated within the encapsulant structure. For instance, such an encapsulation structure may be a mold structure formed by molding the one or more stack-mounted components in a mold tool. Alternatively, the encapsulation may also be accomplished by lamination, so that the encapsulation structure may also be a laminate (such as one or more prepreg sheets). Hence, the at least one stack-mounted component may be encapsulated on top of the stack. Encapsulating the stack-mounted component on top of the stack may properly mechanically and electrically protect said component with respect to an environment. Therefore, even sophisticated electronic applications can be provided with low risk of damage. In particular by molding, the stack-mounted component may be properly protected in a simple way.

In an embodiment, the method comprises mounting at least one com-ponent (in particular a semiconductor chip) on the stack and electrically coupling the at least one component with at least part of the vertically extending electrically conductive through connections only after having completed embedding of the interposer in the stack. Thus, a chip-last manufacturing architecture may be implemented in which the most valuable constituent of the readily manufactured component carrier, i.e., for instance semiconductor chip-type components, are assembled at a very late stage of the manufacturing process. Thus, a high yield may be combined with a high throughput.

In an embodiment, the component carrier comprises a redistribution structure formed on one side of the stack and electrically connected with the interposer. In the context of the present application, the term "redistribution structure" may particularly denote an array of interconnected electrically conductive elements in a dielectric matrix which are configured to translate between relatively small dimensions of structures of a respective interposer or a respective component on the one hand and larger dimensions of structures of component carrier technology (such as the dimension of exterior pads and traces of a printed circuit board (PCB)) on the other hand. A redistribution structure may also be denoted as a circuitry transferring a first spatial spacing (in particular a narrower spacing) of input/output contacts (in particular at a position of an interposer or a component such as a semiconductor chip) into a different second spatial spacing (in particular a wider spacing) of input/output contacts (in particular at an external position of a component carrier such as a printed circuit board). In other words, an electric fan-out function may be provided by a redistribution structure. When a redistribution structure has a substantially planar layer shape, it may also be denoted as a redistribution layer. With such a redistribution structure, it is possible to provide a transfer structure between the tiny small dimensions of the vertically extending electrically conductive connections provided by the interposer and an exterior surface of the component carrier, which can, in turn, be mounted on a base structure such as a printed circuit board.

In an embodiment, the component carrier comprises a further redistribution structure formed on an opposing other side of the stack and electrically connected with the interposer. A double-sided provision of a redistribution structure provides proper connection circuitry with respect to an electronic environment on both opposing main surfaces of the component carrier.

In an embodiment, the interposer additionally comprises horizontally extending traces, to thereby provide a bridging function. Highly advantageously, the provision of horizontal traces as part of the interposer may refine the connection architecture provided by the interposer. As a result, the interposer does not only act as a tool for obtaining compact vertical electric interconnections, but may also contribute to an electric coupling within a horizontal plane. By taking this measure, it is possible that the component carrier with its interposer also fulfils a bridging function in a horizontal plane. At least part of the horizontally extending traces may be electrically coupled with at least part of the vertically extending electrically conductive through connections. Additionally or alternatively, at least part of the horizontally extending traces may be electrically decoupled from at least part of the vertically extending electrically conductive through connections.

In an embodiment, a lowermost electrically conductive layer structure of the interposer has a different, in particular smaller, thickness than a lowermost electrically conductive layer structure of the stack laterally to the interposer. Thus, the thickness of the horizontal electrically conductive structures of interposer and stack may differ. The inlay-type interposer may thus be provided with thinner electrically conductive structures as the component carrier. Thus, the higher integration density of the interposer may not only be realized in terms of the vertical circuitry, but also within a horizontal plane.

In an embodiment, the component carrier comprises an antenna on the stack or on a component which is surface mounted on the stack. Providing an antenna on a top surface of the component carrier may improve the electronic functionality and may render the interposer type component carrier compatible with communication technology applications and/or high frequency applications. As a result, the component carrier can for instance be used for Wi-Fi applications, Bluetooth applications, 5G applications, etc.

In an embodiment, the method comprises forming the stack by lamination. In the context of the present application, the term "lamination" may particularly denote that mechanical pressure and/or heat is used to render partially uncured material flowable, wherein a so triggered cross-linking of the previously at least partially uncured material may make the material re-solidify and become permanently adhesive.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide thermal, electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the electrically insulating layer structure(s) may comprise at least one of the group consisting of resin (such as reinforced or non-reinforced resins, for instance epoxy resin or Bismaleimide-Triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the electrically conductive layer structure(s) may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, any of the above-described components may be a microprocessor. In yet another embodiment, the semiconductor component may be a radio-frequency semiconductor chip configured for emitting and/or receiving radio-frequency signals. Hence, the semiconductor component may be configured for executing a radio frequency application, in particular a radio-frequency application involving frequencies above 1 GHz.

However, any of the above-mentioned components may also be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate or a further component carrier, for example in a board-in-board configuration. The component may be surface mounted on the component carrier and/or may be embedded in an interior thereof.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier and/or the package, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
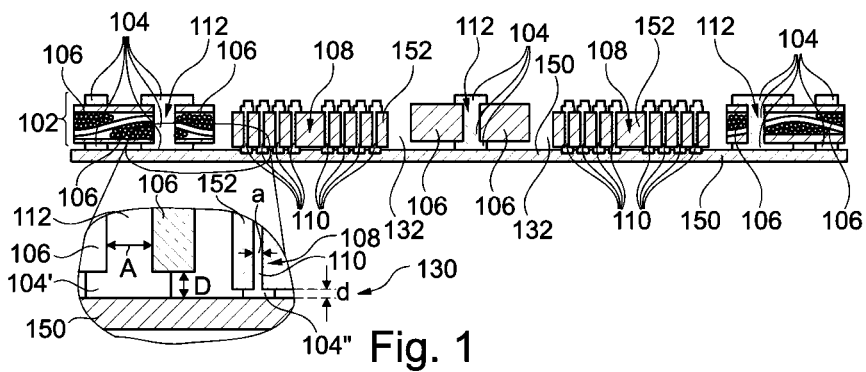
FIG. 1, FIG. 2, FIG. 3, FIG. 4, FIG. 5, FIG. 6, FIG. 7, FIG. 8, FIG. 9 and FIG. 10 illustrate cross-sectional views of structures obtained during carrying out a method of manufacturing component carriers, wherein such a component carrier is shown in FIG. 10, according to an exemplary embodiment of the invention.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment of the invention, a component carrier with stack-embedded interposer and additional lateral electrically conductive structures of the stack is provided. In particular, the interposer may be embedded in a center core of a layer stack of the component carrier. Advantageously, such a manufacturing architecture may be adapted as a chip-last manufacturing architecture in which a component is embedded at a very late stage of the manufacturing process in the component carrier and/or is surface mounted thereon. This may allow manufacturing the component carriers with high yield and reasonable effort.

As advanced semiconductor products are requiring more functionality, maintaining and/or increasing performance, fine-line structuring in substrate has become a key in integration solution including higher input/output counts, high speed, lower power loss and small form factors. This applies to various applications such as mobile phones, tablets, IDC servers and super-computing. In particular for line/space values of 5 μm/5 μm and below, a conventional semi-additive processing organic substrate has limitations for fine structuring. Exemplary embodiments overcome such limits of purely organic substrates for fine-line structuring and provide a high functional chip last manufacturing architecture by embedding one or more interposers in a for instance IC substrate type component carrier. Exemplary embodiments of the invention can also provide more effective solutions for heterogeneous system-in-package (SIP) applications. For example, an electrically non-conductive base body of the interposer may comprise glass or silicon. Copper pillars may be contained in the interposer as vertically extending electrically conductive through connections for interconnection with other functional dies or other embedded or surface-mounted components. Examples for such components are memory chips and ASICs (Application Specific Integrated Circuits). Such an interconnection may be carried out after plasma etching to expose a pillar. Advantageously, a redistribution structure may be formed on the back side of the pillar for providing a fan-out structure. A center core can be a double-sided or multi-layer, depending on a desired or required functionality. It is possible to provide a single interposer or multiple embedded interposers in one component carrier.

After placing the interposer in the cavity of the stack, lamination on the top side may be done for example with an epoxy derivative such as ABF (Ajinomoto® Build-up Film) foil or bonding material to encapsulate the cavity inside. Ajinomoto® is a registered mark of the Ajinomoto Co., Inc., of Tokyo, Japan. A single redistribution layer or multiple redistribution layers may be formed on the back side of the pillar, for example with semi-additive patterning. This may allow obtaining a fan-out structure. The bonding layer on the copper pillar side may be etched with plasma to make a protrusion bump. Thereafter, an additional treatment may be applied to clean the bump surface or metallized or coated with other finish. Functional dies may be attached on the interposer that may have a fiducial for alignment. The physical properties and the flatness of the interposers are highly appropriate for heterogeneous chip assembly. A molding process may be carried out after a surface mounting of a further component (for instance a die assembly).

Advantageously, the interposer may be embedded in a center core of the stack. Further advantageously, it is possible to provide one or more copper pillars on the interposer. Plasma etch may be implemented to expose the interposer. Furthermore, a redistribution layer may be formed on the interposer and the core layer. Yet another advantageous feature is the opportunity to assemble a component (such as a die) on the embedded interposer.

Advantageously, the described manufacturing process is compatible with a semi-additive processing of PCB (printed circuit board) manufacture for providing a line space ratio of for example 5 μm/5 μm and a high input/output count. Furthermore, less redistribution layer effort is implemented as compared to conventional approaches, as a result of the trace interconnection in the center core. No soldering process is required to attach the interposer on the substrate or other kind of component carrier. Furthermore, the embedded interposer may be used to bridge a component (such as a semiconductor die) with respect to another component (such as a further semiconductor die). Moreover, there is a lower risk for die alignment by using fiducials on an interposer.

According to an exemplary embodiment of the invention, a component carrier is provided in which a chip last fan-out manufacturing architecture involving the embedding of an interposer in a center core component carrier (such as a substrate) is provided. For example, the interposer may be embedded in a cavity which has previously been formed in the stack of the component carrier. For instance, such a cavity may be formed using a non-adhesive layer buried within the stack, so that circumferentially cutting a piece out of the stack above the non-adhesive layer creates the cavity.

In an embodiment, a very high bandwidth interconnect between a component (such as a die using proven IC design and fabrication capability) and a component carrier may be provided. Partitioning an integrated circuit (IC) into multiple pieces may be accomplished to decrease die area and therefore increase yield.

Exemplary embodiments of the invention may overcome limits of organic substrates in terms of fine line structuring and may build a highly functional chip-last fan-out package by embedding an interposer in a (in particular substrate type) component carrier.

An exemplary embodiment may provide an interposer embedded in a central core of a layer stack. Preferably, one or more copper pillars may be formed on and/or in the interposer. Advantageously, a plasma etch procedure may be implemented to expose the interposer to enable its electric connection. Preferably, a redistribution layer may be formed on the interposer and a core layer of the layer stack. A die bridge may be provided and assembled on the embedded interposer. Advantageously, such a manufacturing architecture is compatible with a semi-additive processing (SAP) PCB (printed circuit board) process. With such provisions, it may be possible to comply with the challenges of very small line space ratios of 5 µm/5 µm and below. It may also be possible to further increase an input/output count of the component carrier. Further advantageously, less effort for manufacturing redistribution layers may be sufficient as compared to conventional trace interconnection in center core component carriers. Furthermore, it may be advantageous that soldering may be dispensable to attach the one or more interposers on the stack of the component carrier (in particular substrate). Hence, a component carrier with embedded interposer(s) may be provided for creating a die-to-die bridge.

Figure 8:
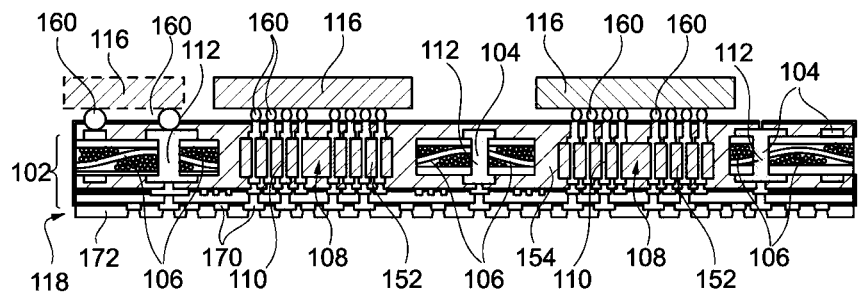
Figure 9:
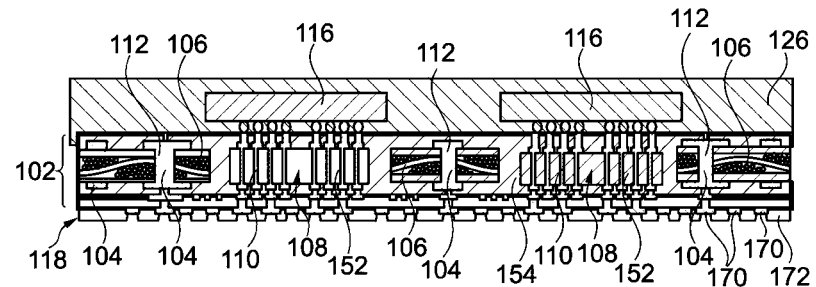
Figure 10:
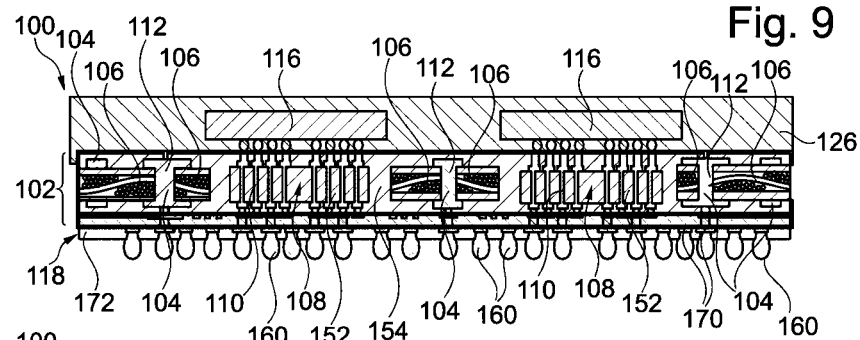

FIG. 1 to FIG. 10 illustrate cross-sectional views of structures obtained during carrying out a method of manufacturing a component carrier 100, shown in FIG. 10, according to an exemplary embodiment of the invention.

Referring to FIG. 1, a core-type laminated stack 102 is provided which comprises electrically conductive layer structures 106 and a central electrically insulating layer structure 104, being connected with one another by lamination (i.e., the application of heat and/or pressure). Through-holes 132 are formed in the stack 102. As shown, the layer stack 102 is composed of multiple planar layer structures 104, 106 as a basis for a plate-shaped laminate type printed circuit board (PCB) component carrier 100 to be manufactured. The electrically conductive layer structures 106 are composed of patterned metal layers such as patterned copper foils and may also comprise vertical through connections such as copper filled laser vias. The electrically insulating layer structure 104 may comprise one or more sheets comprising resin (in particular epoxy resin), optionally comprising reinforcing particles (such as glass fibers or glass spheres) therein. For instance, the electrically insulating layer structure 104 may be made of a fully cured material such as FR4.

Moreover, FIG. 1 shows a temporary carrier 150, such as a sticky tape. The core-type stack 102 is arranged on the temporary carrier 150 which closes the through-holes 132 from a bottom side to create cavities, each for accommodating a respective one of interposers 108.

Thereafter, said interposers 108 may be inserted in the through-holes 132 or cavities formed in the core and may be attached to the sticky temporary carrier 150. For instance, an electrically insulating base body 152 of the interposers 108 may be made of silicon, glass, brass or ceramic. As shown, vertically extending electrically conductive through connections 110 of the interposer 108 may be formed in the base body 152, more precisely extending between its bottom and top. The vertically extending electrically conductive through connections 110 may for instance be made of copper, more specifically may be copper pillars.

As shown, the vertically extending electrically conductive through connections 110 of the interposer 108 have a higher integration density, i.e., a larger number of electrically conductive structures per volume, than electrically conductive structures 112 constituting further vertically extending electrically conductive through connections of the stack 102. For instance, the section of the stack 102 on the left-hand side of FIG. 1 has three electrically conductive elements (one on top of the core, one on bottom of the core, and one extending through the core), whereas the interposer 108 on the left-hand side of FIG. 1 has eight parallel electrically conductive elements in approximately the same volume.

As can be taken from a detail 130 in FIG. 1, each of the vertically extending electrically conductive through connections 110 of the interposer 108 has a smaller cross-sectional area, schematically illustrated as a, compared to a larger cross-sectional area, schematically illustrated as A, of each of the electrically conductive structures 112 of the stack 102. Detail 130 shows as well that a lowermost electrically conductive layer structure 104" of the interposer 108 has a smaller vertical thickness, d, than another vertical thickness, D, of a lowermost electrically conductive layer structure 104' of the stack 102 being arranged laterally to the interposer 108. Thus, the higher integration density of the interposer 108 compared to the stack 102 is also reflected in the different values of the thickness, D>d, of the bottom material (in particular an electrically conductive material such as a metal). The described manufacturing architecture is properly compatible with such a difference in view of the embedding by lamination and subsequent exposure of electrically conductive structures, as described in the following figures.

Figure 2:
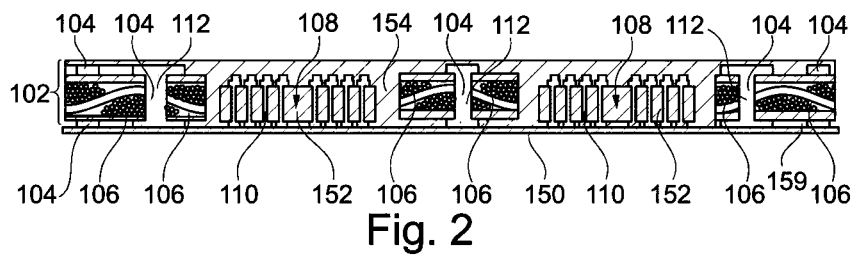

Referring to FIG. 2, the constituents shown in FIG. 1 are then rigidly connected with each other by lamination. Lamination may be accomplished by attaching and curing (by heating and/or applying mechanical pressure) one or more previously uncured electrically insulating layer structures 154, such as a prepreg layer or an epoxy derivative (such as Ajinomoto® Build-up Film, ABF). The material of the uncured electrically insulating layer structure 154 fills gaps between the interposers 108 and the stack 102 and provides a cap layer on top of the constituents, as shown in FIG. 2. This interconnection may be carried out by lamination, i.e., the application of thermal energy and/or pressure. By this lamination process, the material of the previously uncured electrically insulating layer structure 154 becomes flowable, flows into empty gaps, starts cross-linking, thereby cures and becomes again solidified. Small air gaps 159 where resin material did not reach during one-side lamination are depicted in FIG. 2 on a bottom side of the stack 102.

Figure 3:
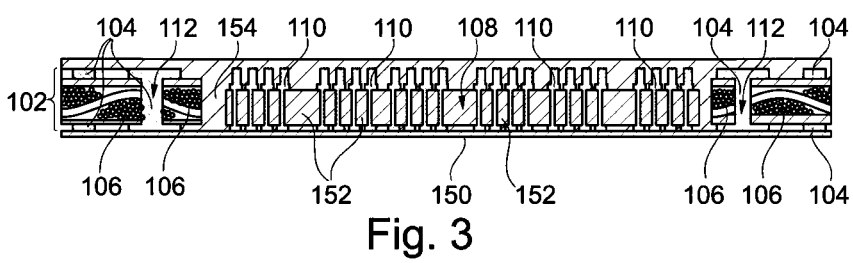

FIG. 3 shows a preform of a component carrier 100 according to another exemplary embodiment, in which not two interposers 108 (as in FIG. 2), but one bigger single interposer 108 is embedded in the core of the stack 102.

Figure 4:
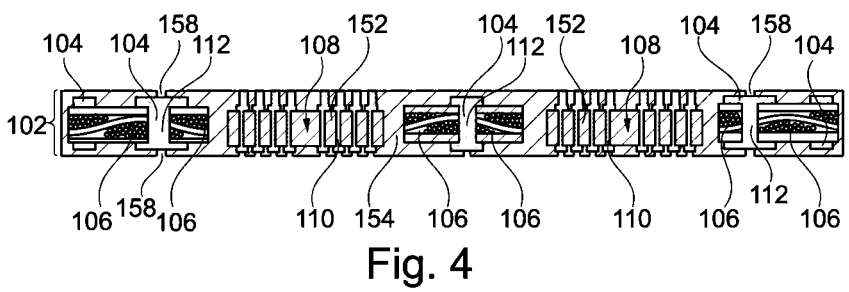

As can be taken from FIG. 4 in combination with FIG. 2, the temporary carrier 150 may then be removed from the lower main surface of the structure shown in FIG. 2 after the lamination, since the constituents of the shown body are now rigidly connected. FIG. 4 shows the results after the processes described referring to FIG. 1 and FIG. 2 and after detaching the temporary carrier 150 as well as after further optional processes, as described below. FIG. 4 thus shows the result of a next process or next processes after FIG. 2 (or alternatively after FIG. 3, as FIG. 2 and FIG. 3 are interchangeable from a process point of view with the only exception that FIG. 2 and FIG. 4 show an embodiment with two interposers 108, whereas FIG. 3 shows an embodiment with one interposer 108). After detaching the temporary carrier 150, an optional but highly preferred additional process of bottom dielectric layer formation may follow to obtain the structure of FIG. 4. A further optional but highly preferred process of redistribution layer formation may also be carried out.

FIG. 4 also shows vias 158 in the main surfaces of the illustrated structure. The vias 158 may be formed with a laser or a photolithographic process.

FIG. 4 shows as well that the vertically extending electrically conductive through connections 110 of the interposers 108 have been exposed at a bottom side after peeling off temporary carrier 150. This exposing may be accomplished for instance by etching (for example by plasma etching) away material of the meanwhile cured electrically insulating layer structure 154. By removing material of the electrically insulating layer structure 154 also on the top side of the structure shown in FIG. 2, the vertically extending electrically conductive through connections 110 may also be exposed on a top side.

Figure 5:
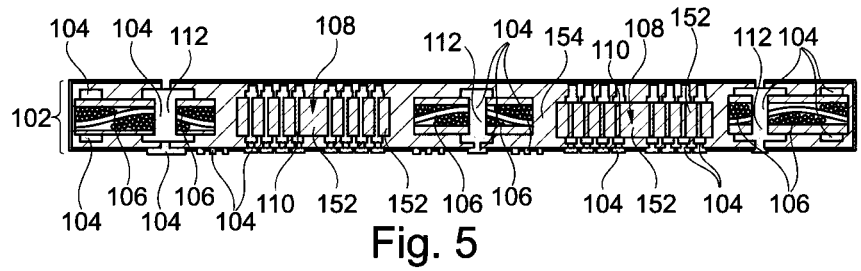

Now referring to FIG. 5, electrically conductive material may be deposited on the lower main surface of the structure shown in FIG. 4, for instance by plating. The deposited material may subsequently be etched. By taking this measure, the vertically extending electrically conductive through connections 110 and the electrically conductive structures 112 may be electrically contacted from a bottom side. Thus, the stack 102 may be extended to a bottom side by a further build-up of one or more layer structures.

Figure 6:
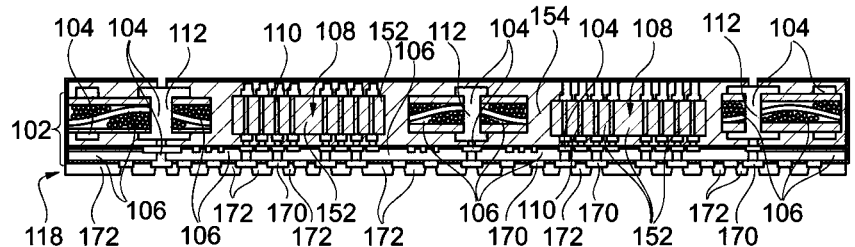

In order to obtain the structure shown in FIG. 6, said further build-up on the bottom side may be continued. This may be accomplished by connecting one or more further electrically conductive layer structures 104 and/or one or more further electrically insulating layer structures 106 to a bottom side of the structure shown in FIG. 5, to thereby further extend laminated stack 102.

Thereafter, formation of a redistribution structure 118 at the lower main surface of the illustrated structure is carried out. Formation of said redistribution structure 118 on the bottom side of the extended stack 102 may be accomplished by a build-up of one or more further electrically conductive layer structures 170 (for instance made of copper) and one or more further electrically insulating layer structures 172 (for instance made of polyimide). A patterning and finish procedure may be carried out to thereby obtain the redistribution structure 118.

Figure 7:
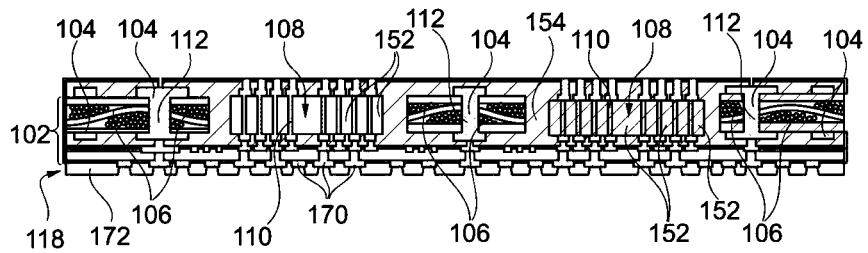

In order to obtain the structure shown in FIG. 7, a full panel plasma etch is carried out.

FIG. 8 shows the result of a die assembly by which components 116 are surface mounted on the structure shown in FIG. 7. Two components 116 are surface mounted on exposed upper main surfaces of the vertically extending electrically conductive through connections 110 of the interposers 108, for instance using solder balls 160. As indicated schematically on the left-hand side of FIG. 8, it is, additionally or alternatively, possible to attach one or more further components 116 for an electric connection with the further electrically conductive structures 112 of the stack 102 laterally to the interposers 108. Solder balls 160 can be used to establish a solder connection between the components 116 on the one hand and the stack 102 or the interposers 108 on the other hand.

As can be taken from FIG. 9, the surface-mounted components 116 may then be encapsulated, for instance by molding. Alternatively, they can also be encapsulated by lamination. Thus, a mold-type encapsulation structure 126 may be formed on top of the stack 102. In said mold-type encapsulation structure 126, the stack-mounted components 116 may be encapsulated by molding to provide mechanical protection and electric isolation.

FIG. 10 illustrates a component carrier 100 according to an exemplary embodiment of the invention obtained by the described manufacturing process, followed by the formation of solder balls 160 at exposed electrically conductive surfaces of redistribution structure 118 on the bottom side.

The component carrier 100 comprises laminated stack 102 composed of the electrically conductive layer structures 104 and the electrically insulating layer structures 106. Two interposers 108 having the vertically extending electrically conductive through connections 110 are embedded side-by-side in the stack 102. Furthermore, electrically conductive structures 112 are formed in the stack 102 laterally on both sides of the interposers 108 as well as between the interposers 108 for contributing to the electric connection in vertical direction. The electrically conductive structures 112 are further vertically extending electrically conductive through connections running in parallel to the electrically conductive through connections 110 but having larger dimensions and smaller integration density. Thus, the vertically extending electrically conductive through connections 110 have a higher integration density than the further vertically extending electrically conductive through connections corresponding to electrically conductive structures 112. As illustrated in FIG. 10, the plurality of vertically extending electrically conductive through connections 110 of the interposer 108 extend through an entire vertical thickness of the interposer 108 and thereby electrically couple a portion of the laminated extended stack 102 below the interposer 108 with another portion of the laminated extended stack 102 above the interposer 108.

As can be seen, the stack 102 comprises a central fully cured core, which may for instance be made of FR4, in which the interposers 108 are reliably and centrally embedded.

Beyond this, the component carrier 100 comprises two components 116 mounted on the stack 102 and arranged side-by-side, i.e., also in a space-saving configuration. For instance, the components 116 may be semiconductor chips, for example memory chip and processor. Said components 116 are electrically connected with the interposers 108. As shown as well, the components 116 are molded in a mold component, as encapsulation structure 126, on the stack 102.

The redistribution structure 118 formed on a lower main surface of the stack 102 is electrically connected with the interposers 108 and with the electrically conductive structures 112 of the stack 102. The redistribution structure 118 may provide a fan-out function.

The component carrier 100 shown in FIG. 10 can be completed by attaching solder balls 160 to the electrically conductive layer structures 170 of the redistribution structure 118. The obtained BGA (Ball Grid Array) architecture allows soldering the component carrier 100 on a base structure (not shown), for instance a printed circuit board.

Figure 11:
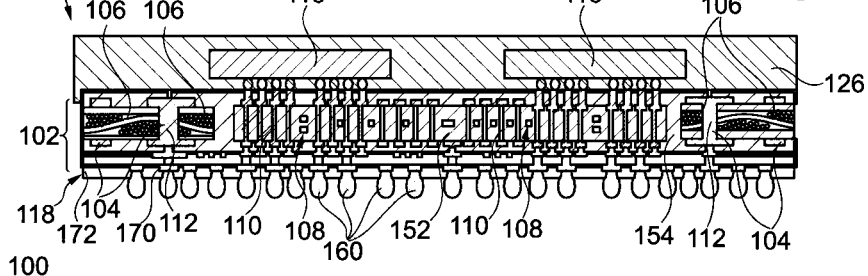
FIG. 11, FIG. 12 and FIG. 13 illustrate cross-sectional views of component carriers according to other exemplary embodiments of the invention.

FIG. 11 illustrates a cross-sectional view of a component carrier 100 according to another exemplary embodiment of the invention which comprises only a single interposer 108. FIG. 11 thus shows another exemplary embodiment of a component carrier 100 which differs from the embodiment of FIG. 10 in that, according to FIG. 11, a single interposer 108 (rather than two interposers 108) is embedded in the core of the stack 102.

Figure 12:
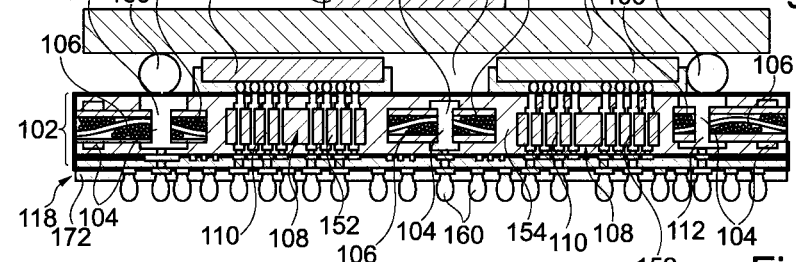

FIG. 12 illustrates a cross-sectional view of a component carrier 100 according to still another exemplary embodiment of the invention.

The embodiment shown in FIG. 12 has a further component 116 surface-mounted on the component carrier 100 and being arranged above and covering the other surface-mounted components 116. More specifically, a cavity 128 is formed between the uppermost largest stack-mounted component 116 and the stack 102. As shown, two smaller stack-mounted components 116 which are also mounted on the stack 102 are both accommodated in a protected fashion in the cavity 128, and in a space-saving configuration. Thus, a highly compact component carrier 100 can be manufactured which shows a high mechanical and electrical reliability. Solder balls 160 may be used for surface-mounting said largest further component 116. As shown, the thickness of the solder balls 160 may be sufficiently large so that the lower and smaller surface-mounted components 116 may be accommodated in a protected way in gap or cavity 128 between the upper-most larger surface-mounted component 116 and the stack 102.

According to FIG. 12, the component carrier 100 also comprises an antenna 124 on the largest component 116 which is surface mounted on the stack 102. By taking this measure, it may be possible to provide the component carrier 100 with a communication functionality.

Figure 13:
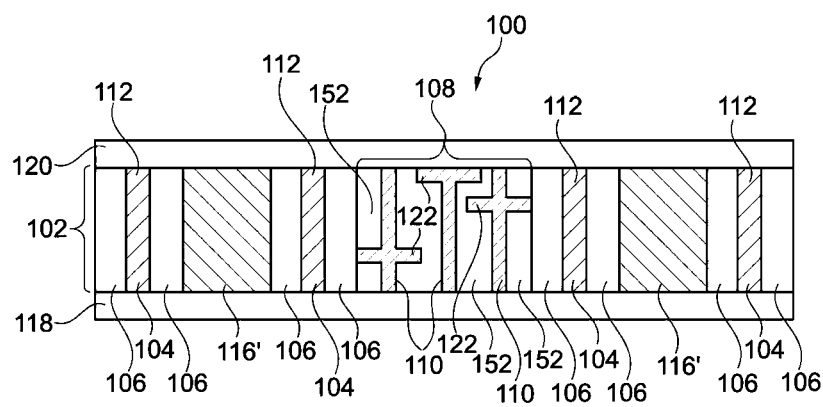

FIG. 13 illustrates a cross-sectional view of a component carrier 100 according to another exemplary embodiment of the invention.

The embodiment of FIG. 13 additionally comprises two components 116' embedded in the stack 102 laterally of the (here single) interposer 108. As shown, the interposer 108 comprises also horizontally extending traces 122, to thereby provide a bridging function.

Moreover, the component carrier 100 according to FIG. 13 comprises a further redistribution structure 120 which is formed on an opposing other side of the stack 102 (i.e., on the top side of the stack 102) and is electrically connected with the interposer 108.

The embodiment of FIG. 13 hence differs from the previously described embodiments concerning certain aspects. Firstly, redistribution layers 118, 120 are formed on both opposing main surfaces of the illustrated component carrier 100. Secondly, components 116' (for instance semiconductor dies) are embedded in the stack 102 side by side with the interposer 108. Thirdly, the interposer 108 is provided with horizontal traces 122 providing an electrical bridging function.

Figure 14:
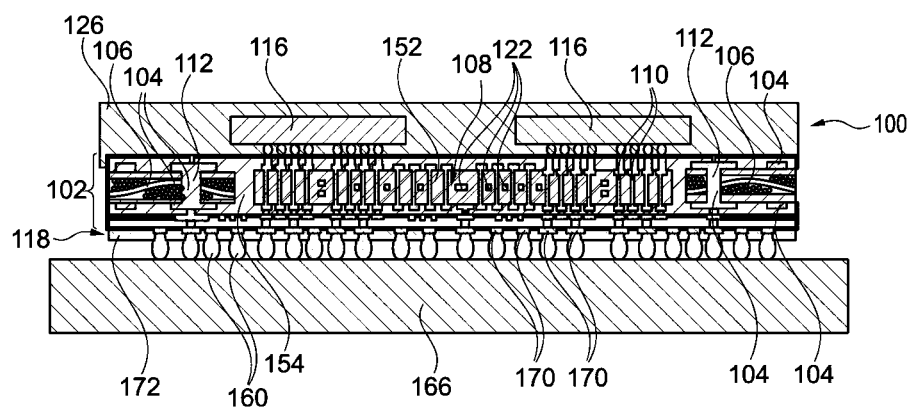
FIG. 14 shows a component carrier according to still another exemplary embodiment of the invention being mounted on a mounting base.

FIG. 14 shows a component carrier 100 according to another exemplary embodiment of the invention being mounted via its solder balls 160 on a mounting base 166, such as a printed circuit board (PCB). In the embodiment of FIG. 14, horizontal or lateral connections 122 within the interposer 108 are illustrated which may provide a bridging function.

Figure 15:
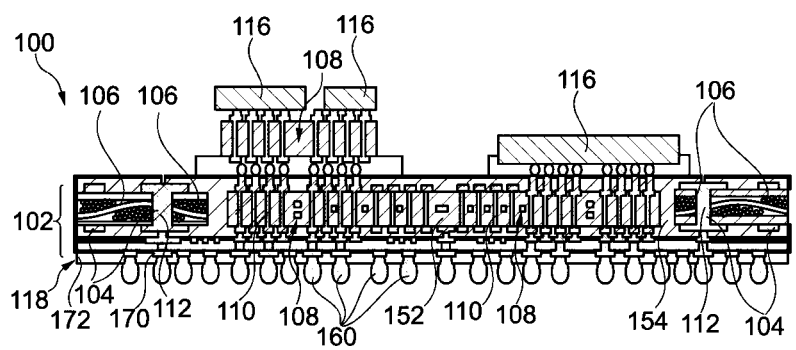
FIG. 15 and FIG. 16 illustrate cross-sectional views of component carriers according to other exemplary embodiments of the invention.

FIG. 15 illustrates a cross-sectional view of a component carrier 100 according to another exemplary embodiment of the invention.

The component carrier 100 according to FIG. 15 is similar to the component carrier 100 according to FIG. 11 but differs from the latter in that the component carrier 100 according to FIG. 15 does not comprise encapsulation structure 126. Furthermore, a further interposer 108 is surface-mounted on stack 102. Moreover, one or more components 116 may be mounted on the surface-mounted further interposer 108.

Figure 16:
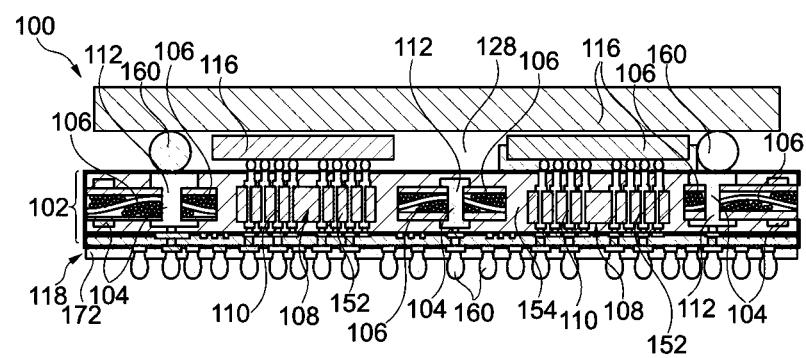

FIG. 16 illustrates a cross-sectional view of a component carrier 100 according to still another exemplary embodiment of the invention.

The component carrier 100 according to FIG. 16 is similar to the component carrier 100 according to FIG. 12 but differs from the latter in that the component carrier 100 according to FIG. 16 does not have antenna 124. Furthermore, one of the further components 116 being surface mounted on stack 102 below the larger uppermost component 116 is arranged in a different way in FIG. 16. For instance, said differently arranged component 116 may be a semiconductor chip or a further interposer.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
    a stack comprising a plurality of layers with an electrically conductive layer structure and an electrically insulating layer structure arranged one on top of the other;
    at least one interposer having a plurality of vertically extending through connections and being embedded in the electrically insulating layer structure of the stack, wherein in ene a direction of the stack the plurality of vertically extending through connections include respective protruding bumps that extend continuously beyond the at least one interposer and through the electrically insulating layer structure to an external surface of the component carrier;
    electrically conductive structures in the electrically insulating layer structure arranged laterally on both sides of the at least one interposer, such that the electrically conductive structures are perpendicular to the direction of the stack; and
    a component indirectly connected to the protruding bumps, the plurality of vertically extending through connections extending continuously beyond the at least one interposer up to a main surface of the stack, where the component is connected by a respective plurality of connections in an environment of the component carrier.

2. The component carrier according to claim 1, further comprising:
    vertically extending electrically conductive through connections in the electrically insulating layer structure arranged laterally on both sides of the at least one interposer in the direction of the stack.

3. The component carrier according to claim 1, wherein the stack comprises a core in which the interposer is embedded.

4. The component carrier according to claim 1, wherein the component carrier comprises only a single interposer.

5. The component carrier according to claim 1, wherein the component carrier comprises a plurality of interposers embedded in the stack and arranged side-by-side.

6. The component carrier according to claim 1, wherein a cavity is formed between the component and the stack, and wherein a second component mounted on the stack is accommodated in the cavity.

7. The component carrier according to claim 1, further comprising:
an encapsulation structure on the stack in which the component is encapsulated.

8. The component carrier according to claim 1, wherein the component is selected from an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

9. The component carrier according to claim 1, further comprising:
a redistribution structure formed on one side of the stack and electrically connected with the interposer.

10. The component carrier according to claim 1, wherein the interposer comprises horizontally extending traces.

11. The component carrier according to claim 1, wherein a lowermost electrically conductive layer structure of the interposer has a different thickness than another thickness of a lowermost electrically conductive layer structure of the stack laterally to the interposer.

12. The component carrier according to claim 1, further comprising:
an antenna mounted on the stack or mounted on a component which is surface mounted on the stack.

13. The component carrier according to claim 1, wherein the vertically extending through connections extend through an entire vertical thickness of the interposer to thereby electrically couple a portion of the stack below the interposer with another portion of the stack above the interposer.

14. The component carrier according to claim 1, comprising at least one of the following features:
wherein the electrically conductive layer structure comprises at least one of copper, aluminum, nickel, silver, gold, titanium, palladium, and tungsten;
wherein the electrically insulating layer structure comprises at least one of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of a printed circuit board, and a substrate, or a preform thereof;
wherein the component carrier is configured as a laminate-type component carrier.

15. The component carrier according to claim 2, comprising at least one of the following features:
wherein the vertically extending through connections of the interposer have a higher integration density than the vertically extending electrically conductive through connections in the electrically insulating layer structure of the component carrier;
wherein each of the vertically extending through connections of the interposer has a smaller cross-sectional area than another cross-sectional area of each of the respective vertically extending electrically conductive through connections in the electrically insulating layer structure of the component carrier.

16. The component carrier according to claim 9, further comprising:
a further redistribution structure electrically connected with the interposer.

17. A method of manufacturing a component carrier, comprising:
providing a stack comprising an electrically conductive layer structure and an electrically insulating layer structure arranged one directly on top of the other;
embedding at least one interposer, having a plurality of vertically extending through connections, in the electrically insulating layer structure of the stack, wherein in a direction of the stack the plurality of vertically extending through connections include respective protruding bumps that extend continuously beyond the at least one interposer and through the electrically insulating layer structure to an external surface of the component carrier;
forming electrically conductive structures in the electrically insulating layer structure laterally on both sides of the at least one interposer, such that the electrically conductive structures are perpendicular to the direction of the stack; and
subsequently mounting at least one component on the component carrier by indirectly electrically coupling the at least one component with at least some of the protruding bumps, wherein the plurality of vertically extending through connections extend continuously beyond the at least one interposer to a main surface of the stack, where a respective plurality of connections extend into an environment of the component carrier where the at least one component is coupled to the component carrier.

18. A component carrier, comprising:
a stack comprising an electrically conductive layer structure and an electrically insulating layer structure arranged one on top of the other;
at least one interposer having a plurality of vertically extending through connections and being embedded in the at least one electrically insulating layer structure of the stack,
wherein in a direction of the stack the plurality of vertically extending through connections include respective protruding bumps that extend continuously beyond the at least one interposer and through the electrically insulating layer structure to a main surface of the component carrier; and
electrically conductive structures in the stack arranged laterally on both sides of the at least one interposer, such that the electrically conductive structures traverse the electrically insulating layer structure in the direction of the stack; and
a component connected to the component carrier by the protruding bumps and respective connections in an environment of the component carrier.

19. The component carrier of claim 18, further comprising:
an encapsulation structure on the stack in which the component is encapsulated.

* * * * *

UNITED STATES PATENT AND TRADEMARK OFFICE
CERTIFICATE OF CORRECTION

| | | |
|---|---|---|
| PATENT NO. | : 12,165,964 B2 | Page 1 of 1 |
| APPLICATION NO. | : 17/247430 | |
| DATED | : December 10, 2024 | |
| INVENTOR(S) | : Minwoo Lee | |

It is certified that error appears in the above-identified patent and that said Letters Patent is hereby corrected as shown below:

In the Claims

In Claim 1, Column 16, Line 32, after "wherein in" remove -- ene --.

Signed and Sealed this
Eighteenth Day of February, 2025

Coke Morgan Stewart
*Acting Director of the United States Patent and Trademark Office*